United States Patent [19]
Gardner et al.

[11] Patent Number: 5,940,698
[45] Date of Patent: Aug. 17, 1999

[54] METHOD OF MAKING A SEMICONDUCTOR DEVICE HAVING HIGH PERFORMANCE GATE ELECTRODE STRUCTURE

[75] Inventors: Mark I Gardner, Cedar Creek; Mark C. Gilmer, Austin, both of Tex.

[73] Assignee: Advanced Micro Devices, Austin, Tex.

[21] Appl. No.: 08/982,198

[22] Filed: Dec. 1, 1997

[51] Int. Cl.⁶ .................................................. H01L 21/336
[52] U.S. Cl. .......................... 438/197; 438/585; 438/586; 438/591; 438/653; 438/643; 438/687
[58] Field of Search ................................. 438/585, 586, 438/591, 592, 595, 596, 653, 666, 674, 643, 687, 197, 299, 300

[56] References Cited

U.S. PATENT DOCUMENTS

| | | | |
|---|---|---|---|
| 4,784,718 | 11/1988 | Mitani et al. | 438/183 |
| 5,314,832 | 5/1994 | Deleonibus | 438/297 |
| 5,397,909 | 3/1995 | Moslehi | 257/383 |
| 5,429,987 | 7/1995 | Allen | 437/187 |
| 5,447,874 | 9/1995 | Grivna et al. | 437/40 |
| 5,501,995 | 3/1996 | Shin et al. | 437/41 |
| 5,672,530 | 9/1997 | Hsu | 438/586 |
| 5,677,217 | 10/1997 | Tseng | 438/586 |
| 5,688,700 | 11/1997 | Kao et al. | 437/29 |
| 5,714,398 | 2/1998 | Chao et al. | 438/586 |
| 5,716,861 | 2/1998 | Moslehi | 437/40 |
| 5,804,846 | 9/1998 | Fuller | 257/252 |
| 5,830,810 | 11/1998 | Shiralagi et al. | 438/586 |

*Primary Examiner*—John F. Niebling
*Assistant Examiner*—Lynne A. Gurley
*Attorney, Agent, or Firm*—Merchant, Gould, Smith, Edell, Welter & Schmidt, P.A.

[57] ABSTRACT

A semiconductor device having a high performance gate electrode structure and a process of fabricating such a device. A semiconductor device in accordance with an embodiment of the invention is formed by forming a gate insulating layer is over a substrate. A diffusion barrier layer is formed over the gate insulating layer and a trench is formed in the diffusion barrier layer. In the trench, a metal gate electrode is formed. The diffusion barrier layer impedes diffusion of the metal gate electrode into the gate insulating layer during, for example, subsequent processing. The gate insulating layer, the barrier layer, and the gate electrode may, for example, be formed from cobalt niobate, tantalum silicon nitride, and copper, respectively. The copper gate electrode and cobalt gate insulating layer can, for example, increase the speed of the semiconductor device as compared to conventional transistors.

21 Claims, 4 Drawing Sheets

METHOD OF MAKING A SEMICONDUCTOR DEVICE HAVING HIGH PERFORMANCE GATE ELECTRODE STRUCTURE

FIELD OF THE INVENTION

The present invention is generally directed to semiconductor devices and, more particularly, to semiconductor devices having high performance gate electrode structures.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applications in numerous disciplines. One such silicon-based semiconductor device is a metal-oxide-semiconductor (MOS) transistor.

The principal elements of a typical MOS semiconductor device are illustrated in FIG. 1. The device generally includes a semiconductor substrate 101 on which a gate electrode 103 is disposed. The gate electrode 103 acts as a conductor. An input signal is typically applied to the gate electrode 103 via a gate terminal (not shown). Heavily-doped source/drain regions 105 are formed in the semiconductor substrate 101 and are connected to source/drain terminals (not shown). The source/drain regions 105 may, for example, be lightly-doped drain (LDD) source/drain regions as shown. As illustrated in FIG. 1, the typical MOS transistor is symmetrical, which means that the source and drain are interchangeable. Whether a region acts as a source or drain depends on the respective applied voltages and the type of device being made (e.g., PMOS, NMOS, etc.). Thus, as used herein, the term source/drain region refers generally to an active region used for the formation of a source or drain.

A channel region 107 is formed in the semiconductor substrate 101 beneath the gate electrode 103 and separates the source/drain regions 105. The channel is typically lightly doped with a dopant of a type opposite to that of the source/drain regions 105. The gate electrode 103 is generally separated from the semiconductor substrate 101 by an insulating layer 109, typically an oxide layer such as $SiO_2$. The insulating layer 109 is provided to prevent current from flowing between the gate electrode 103 and the source/drain regions 105 or channel region 107.

In operation, an output voltage is typically developed between the source and drain terminals. When an input voltage is applied to the gate electrode 103, a transverse electric field is set up in the channel region 107. By varying the transverse electric field, it is possible to modulate the conductance of the channel region 107 between the source region and the drain region. In this manner, an electric field controls the current flow through the channel region 107. This type of device is commonly referred to as a MOS field-effect-transistor (MOSFET).

Semiconductor devices, like the one described above, are used in large numbers to construct most modern electronic devices. As a larger number of such devices are integrated into a single silicon wafer, improved performance and capabilities of electronic devices can be achieved. Device performance can be further improved by increasing the operating speeds and reliability of the transistors on a device. Accordingly, improvements to transistor structures (e.g., source and drains, gate electrode, gate insulating layer) are continually sought in order to increase the operating speeds and reliability of the transistors.

SUMMARY OF THE INVENTION

The present invention is generally directed to a semiconductor device having a high performance gate electrode structure and a process of fabricating such a device. The high performance gate electrode structure may, for example, increase the operating speed and reliability of the semiconductor device.

In accordance with an embodiment of the invention, a process of fabricating a semiconductor device is provided in which a gate insulating layer is formed over a substrate. A diffusion barrier layer is formed over the gate insulating layer and a trench is formed in the diffusion barrier layer. In the trench, a metal gate electrode is formed. The diffusion barrier layer impedes diffusion of the metal gate electrode into the gate insulating layer during, for example, subsequent processing.

In one particular embodiment, the gate insulating layer is formed from cobalt niobate, the barrier layer is formed from tantalum silicon nitride, and the gate electrode is formed from copper. The copper gate electrode and cobalt gate insulating layer can, for example, increase the speed of the semiconductor device as compared to conventional transistors.

In accordance with another embodiment of the invention, a process of fabricating a semiconductor device is provided in which elevated active regions are formed over a substrate. A gate insulating layer is formed between the active regions. A barrier layer is formed over the gate insulating layer and the active regions. Two dielectric regions are formed which isolate a first portion of the barrier layer over the gate insulating layer from second portions of the barrier layer over the active regions. Conductive contacts are then formed on each of the first portion and second portions of the barrier layer. The conductive contact over the gate insulating layer may, for example, act as the gate electrode for a semiconductor device. In accordance with one particular embodiment, the gate insulating layer is formed from cobalt niobate, the barrier layer is formed from tantalum silicon nitride, and the conductive contacts are formed from copper.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
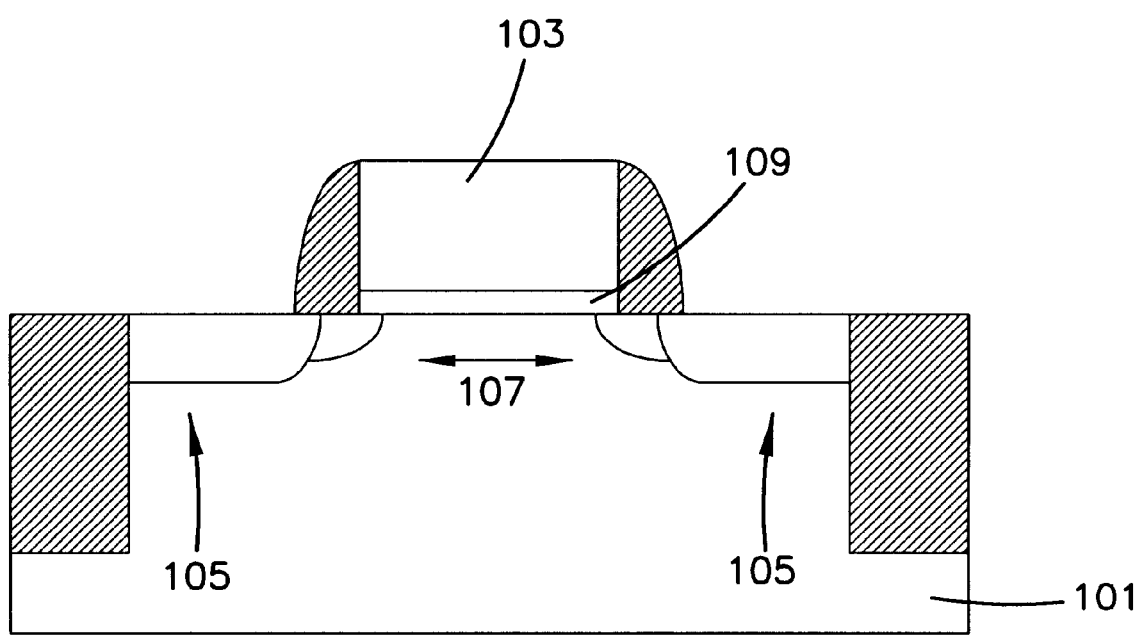
FIG. 1 illustrates a conventional MOS transistor.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE DRAWINGS

The present invention generally relates to semiconductor devices including, for example, MOS, CMOS, and Bi-CMOS devices, having high performance gate electrode structures. The term gate electrode structure is used herein to describe a structure including a gate electrode and a gate insulating layer. Aspects of the present invention are, in particular, directed to gate electrode structures having cobalt niobate gate insulating layers and copper gate electrodes. While the present invention is not so limited, details of the present invention will be illustrated through the discussion which follows.

Figure 2A:
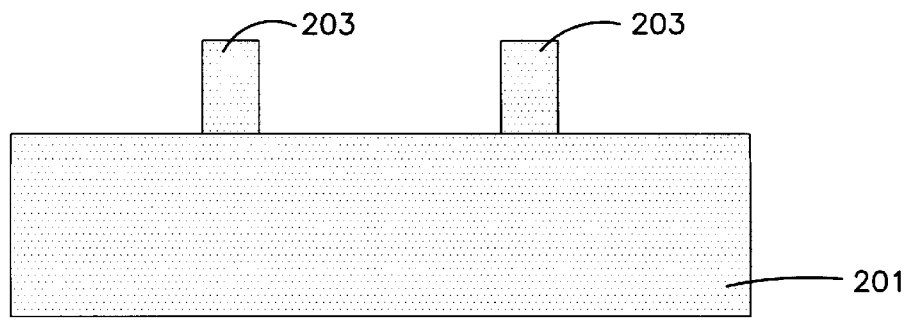
FIGS. 2A–2G illustrate an exemplary process in accordance with one embodiment of the invention.

FIGS. 2A–2G illustrate an exemplary process for fabricating an semiconductor device having a high performance gate electrode structure. In accordance with this embodiment, elevated or raised active regions 203 are formed over a substrate 201. The resultant structure is illustrated in FIG. 2A. The active regions 203 are used as source/drain regions for the semiconductor device.

The elevated active regions 203 may be formed, for example, using any of a number of well-known techniques. In accordance with one technique, the elevated active regions 203 are formed by selectively growing polysilicon over the substrate 201. The selective growth of polysilicon may be done using, for example, selective epitaxial deposition techniques. Using this technique, the elevated active regions 203 may, for example, be doped in-situ during the selective growth of polysilicon.

In accordance with another technique, the elevated active regions 203 are formed by selectively removing portions of the semiconductor substrate 201 to leave elevated portions used to form the elevated active regions 203. The selective removal of the substrate 201 may be performed using, for example, well-known photolithography and etching techniques. Using this technique, the elevated active regions 203 are typically doped prior to removing portions of the substrate 201.

A gate insulating layer will be formed between the elevated active regions 203. The height of the elevated active regions 203 is suitably selected in consideration of the desired height or thickness of the gate insulating layer. Suitable heights for the active regions 203 range from about 100 to 400 angstroms (Å) for many the applications. A gate electrode will be formed between the elevated active regions 203. The distance between the elevated active regions 203 is suitably selected in consideration of the desired width of the gate electrode. Suitable distances between the active regions 203 range from about 0.1 to 0.25 microns for many applications.

Figure 2B:
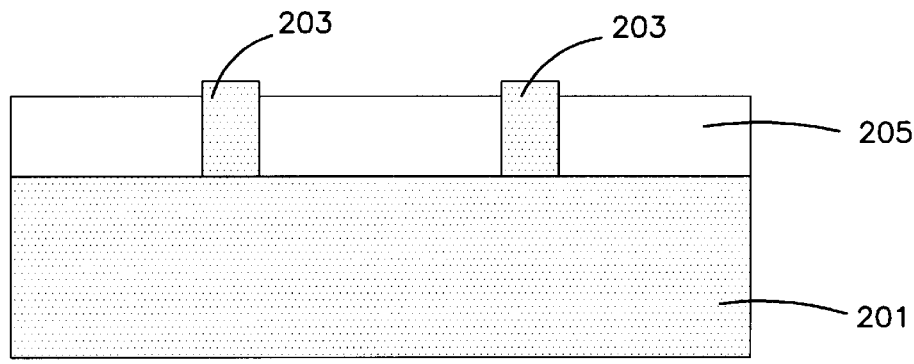

A gate insulating layer 205 is formed over the substrate 201 between the elevated active regions 203, as illustrated in FIG. 2B. The gate insulating layer 205 may be formed from a number of different dielectric materials using a number of different techniques. In the example embodiment, the gate insulating layer 205 is formed from cobalt niobate ($CoNb_2O_6$). A cobalt niobate gate insulating layer 205 may, for example, be formed by sputtering cobalt niobate onto the substrate 201 using a cobalt niobate target. This may be done using, for example, well-known techniques.

The cobalt niobate advantageously has a higher permittivity (i.e., dielectric constant, k) than that of silicon dioxide which is normally used to form the gate insulating layer of conventional transistors. The permittivity of cobalt niobate is about 18–33, while silicon dioxide has a permittivity of about 4. The thickness of the gate insulating layer 205 is suitably selected in consideration of the desired properties of the gate insulating layer 205. Suitable cobalt niobate gate insulating layer 205 thicknesses range from about 100–400 Å for many applications. For these thicknesses, the cobalt niobate gate insulating layer (assuming a dielectric constant of 32) has an equivalent silicon dioxide thickness of about 12.5 to 25 Å (i.e., 100–400 Å of the cobalt niobate has the equivalent capacitive characteristics as about 12.5 to 25 Å of silicon dioxide).

As noted above, the invention is not limited to the use of cobalt niobate for the gate insulating layer 205. Other dielectric materials including, for example, other high permittivity dielectrics, such as barium strontium titanate $Ba_{1-x}Sr_xO_3$ (BST), tantalum oxide $Ta_xO_y$, lead zirconate titanate (PZT), and lead lanthanum zirconate titanate (PLZT), as well as silicon dioxide may be used with the present invention.

Figure 2C:
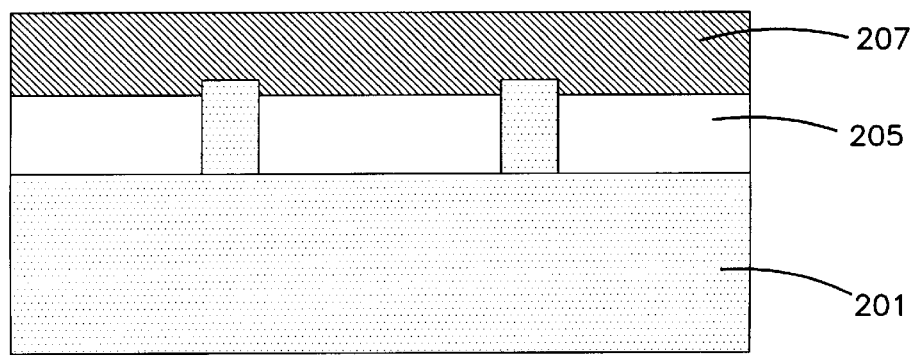

A barrier layer 207 is formed over the substrate 201, as illustrated in FIG. 2C. The barrier layer 207 will be used to form a diffusion barrier between the gate insulating layer 205 and a subsequently-formed gate electrode. The barrier layer 207 may also be used to form a diffusion barrier between the elevated active regions 203 and contacts used for electrically contacting the elevated active regions 203. The barrier layer 207 may be formed of a number of different materials, including conductive materials, which favorably interact with the gate insulating layer 205 and the gate electrode (and, in the example embodiment, favorably interact between the active regions 203 and the subsequently formed active region contacts). The barrier layer 207 may also be formed using a number of different techniques including, for example, deposition.

In the example embodiment, the barrier layer 207 is formed from tantalum silicon nitride ($Ta_{36}Si_{14}N_{15}$) using, for example, a sputter deposition or PVD technique. After deposition, the tantalum silicon nitride layer is typically planarized. This may, for example, be done using well-known chemical-mechanical polishing techniques. A tantalum silicon nitride barrier layer favorably interacts with cobalt niobate as well as metals, such as copper, which may be used to form the gate contact and active region contacts. In addition, tantalum silicon nitride is conductive.

Portions of the barrier layer 207 will be removed to form a trench for the gate electrode, and, in the example embodiment, trenches for active region contacts. The thickness of the barrier layer 207 is suitably selected in consideration of the desired thickness of the gate electrode (and the active region contacts). Suitable thicknesses (measured from the top of the gate insulating layer 205) range from about 2000 to 6000 Å for many applications.

Figure 2D:
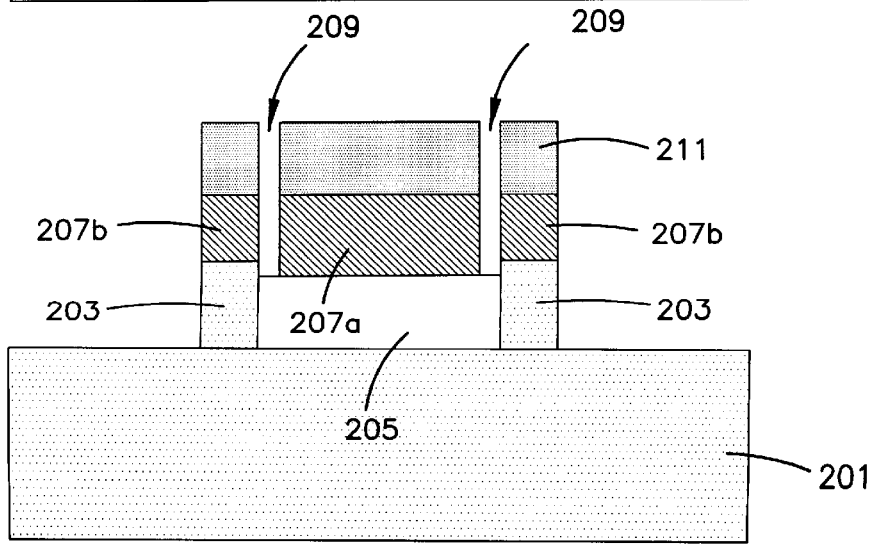
Figure 2E:
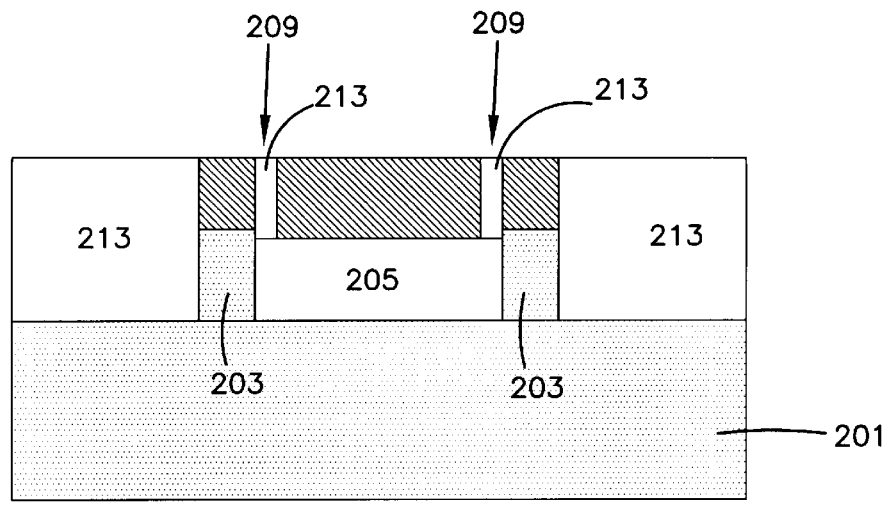

Portions of the barrier layer 207 are removed to form trenches 209 which isolate a first barrier layer portion 207A over the gate insulating layer 205 from second barrier layer portions 207B over the active regions 203. In the illustrated embodiment, the trenches 209 are formed by forming a patterned masking layer 211 over the substrate 201 and removing portions of the barrier layer 207 exposed by the pattern masking layer 211. The patterned masking layer 211 may be formed using well-known photolithography techniques. The resultant structure is illustrated in FIG. 2D.

The trenches 209 will be filled with a dielectric material and used to insulate the gate electrode from the active region contacts. The width and depth of the trenches 209 are suitably selected in consideration of the desired separation between the gate electrode and the active region contacts, while taking into account the type of dielectric material used. Suitable widths of the trenches 209 range from about 50 to 100 Å for many applications. The depth of the trenches 209 typically extends to at least the top surface of the gate insulating layer 205. In this manner, the trenches 209 insulate the elevated active regions 203 from the gate electrode.

The masking layer 211 is removed and a dielectric material 213 is formed over the substrate 201. The dielectric material 213 generally fills the trenches 209 and also covers regions of the substrate adjacent the elevated active regions 203. The layer of dielectric material 213 is typically formed by depositing the dielectric material 213 over the substrate and planarizing the dielectric material such that the top surface of the dielectric material 213 lies in substantially the same plane as the top surface of the barrier layer 217. This may be done using, for example, well-known deposition and polishing techniques. The dielectric material 213 may be formed of a number of different relatively low permittivity dielectric materials including, for example, silicon dioxide.

Trenches 215a and 215b are formed in the barrier layer portions 207a and 207b above the gate insulating layer 205 and the elevated active regions 203, respectively. In the example embodiment, this is performed by forming a masking layer 217 over the substrate 201, selectively removing portions of the masking layer 217 to expose portions of the barrier layer 207, and removing portions of the exposed barrier layer 207 to form the trenches 215a and 215b. The masking layer 217 may be formed using, for example, well-known photolithography and etching techniques. Removal of portions of the barrier layer 207 to form the trenches 215a and 215b may, for example, be performed using well-known etching techniques. One suitable etching technique is a plasma etching.

The dimensions of the trenches 215a and 215b are suitably selected in consideration of the desired remaining amount of the barrier layer 207 surrounding the trenches 215a and 215b. The remaining amount of the barrier layer 207 is selected to provide an adequate diffusion barrier for the material used to fill the trenches 215a and 215b, taking into consideration subsequent thermal processing. In the example embodiment, the trenches 215a and 215b are formed to provide a U-shaped layer of barrier material around the trenches 215a and 215b. Suitable thicknesses of the U-shaped layer of barrier material range from about 50 to 100 Å or more for many applications.

The masking layer 217 is removed and a conductive material 219 is formed over the substrate 201 to fill the trenches 215a and 215b. The conductive material 219 may be planarized such that the top surface of the conductive material lies flat with the top surface of the dielectric material 213. The resultant structure is illustrated in FIG. 2F.

The conductive material 219 may be formed of a number of different materials including, for example, metals such as copper, aluminum or tungsten, or even doped polysilicon. In the example embodiment, the conductive material 219 is formed from copper. The copper may, for example, be formed by depositing a layer of copper using, for example, electroplating or metal-organic chemical vapor deposition (MOCVD) techniques. The copper may be planarized with the top surface of the dielectric material 213 using, for example, well-known chemical-mechanical polishing techniques.

Figure 2F:
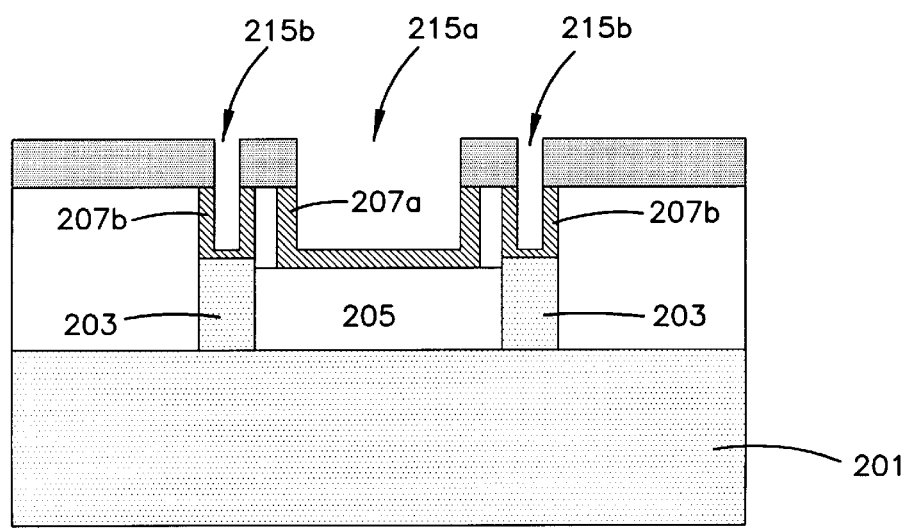
Figure 2G:
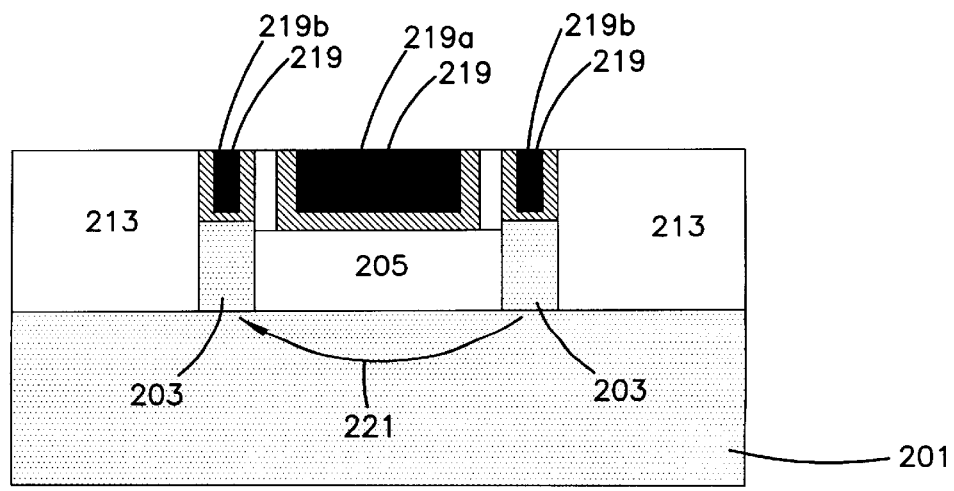

The resultant structure illustrated in FIG. 2F generally includes a gate electrode 219a and contacts 219b formed from the conductive material 219. In operation, the gate electrode 219a modulates a current flow 221 between the active regions 203.

Fabrication may continue with known processing steps including, for example, interconnect formation and so forth to form the ultimate device structure. During these subsequent processing steps, the semiconductor device typically undergoes some thermal processing, usually at temperatures 500° C. or less. During this thermal processing, the barrier layer 207 prevents the conductive material 219 used to form the gate electrode 219a and contacts 219b from diffusing there through. In this manner, the barrier layer 207 prevents any shorts between the gate electrode 219a and the contacts 219a or between the gate electrode 219a and the active regions 203. The barrier layer 207 also prevents the gate electrode 219b material from (e.g., copper) diffusing into the gate insulating layer 205.

Using the above process, semiconductor devices having high performance gate electrode structures can be formed. In particular, gate electrode structures having a cobalt niobate gate insulating layer and a copper gate electrode can be formed. The cobalt niobate increases device performance by, for example, reducing the equivalent gate oxide thickness between the gate electrode and the substrate. The copper provides a high conductance gate electrode and increases the speed of the device.

Figure 3A:
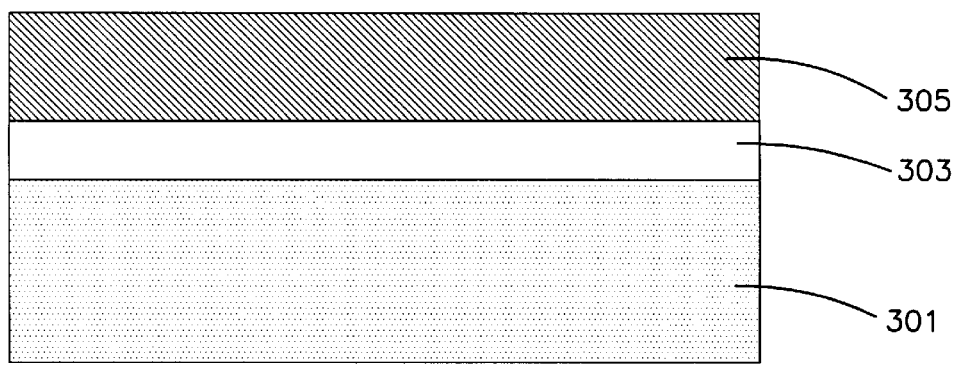
FIGS. 3A–3C illustrate an exemplary process in accordance with another embodiment of the invention.
Figure 3B:
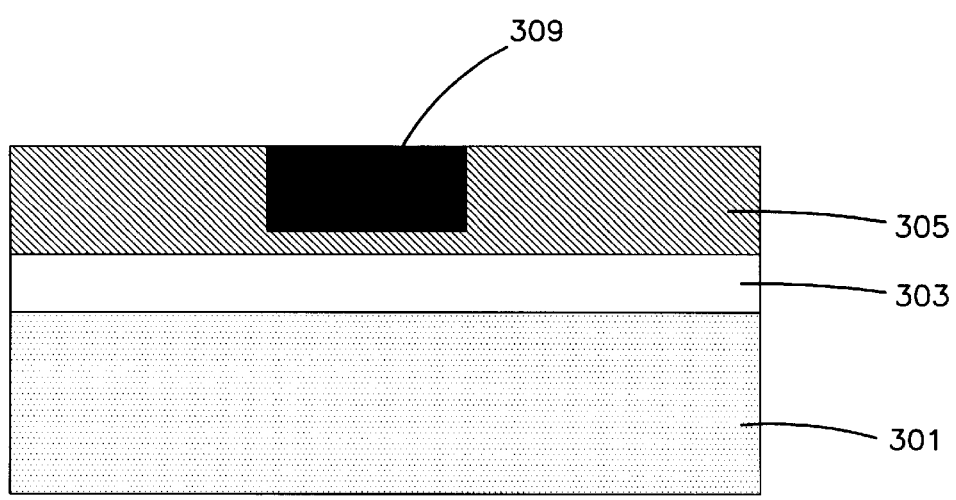
Figure 3C:
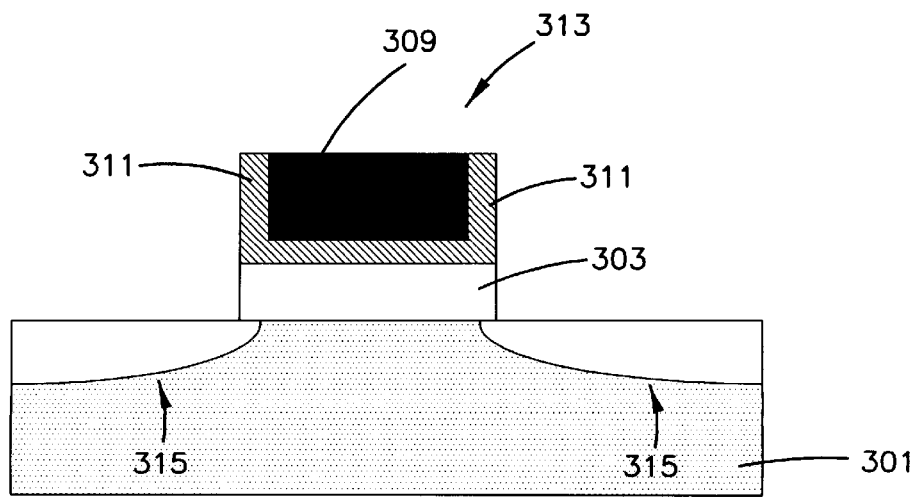

FIGS. 3A–3C illustrate another exemplary process for forming a high performance gate electrode structure. Consistent with this exemplary process, a gate insulating layer 303 is formed over the substrate 301 and a diffusion barrier layer 305 is formed over the gate insulating layer 303. The resultant structure is illustrated in FIG. 3A. The gate insulating layer 303 may be formed from a number of dielectric materials using a number of different techniques. In the example embodiment, the gate insulating layer 303 is formed from cobalt niobate. The cobalt niobate may, for example, be formed using sputter or PVD deposition techniques. The thickness of the gate insulating layer is suitably selected in consideration of the properties of the gate insulating layer 303. Suitable cobalt niobate gate insulating layer 303 thicknesses range from about 100–400 Å for many applications. For these thicknesses, the cobalt niobate gate insulating layer (assuming a dielectric constant of 32) has an equivalent silicon dioxide thickness of about 12.5 to 25 Å.

The barrier layer 305 will be used to form a diffusion barrier between the gate insulating layer 303 and a subsequently-formed gate electrode. The barrier layer 305 may be formed from a number of different materials, including conductive materials, which favorably interact with the gate insulating layer 303 and the gate electrode. The barrier layer 305 may also be formed using a number of different techniques including, for example, deposition.

In an example embodiment, the barrier layer 305 is formed from tantalum silicon nitride using, for example, a sputter deposition or PVD technique. After deposition, the tantalum silicon nitride layer is typically planarized. This may, for example, be done using well-known chemical-mechanical polishing techniques. A portion of the barrier layer 305 will be removed to form a trench for the gate electrode. The thickness of the barrier layer 305 (measured from the top of the gate insulating layer 25) is suitably selected in consideration of the desired thickness of the gate electrode. Suitable thicknesses range from about 2,000–6,000 Å for may applications.

A portion of the barrier layer 305 is removed to form a trench in the barrier layer 305. The trench may, for example, be formed using well-known photolithography and etching techniques. The width of the trench will be selected in consideration of the desired channel width of the result and transistor. The depth of the trench is suitably selected in consideration of the desired remaining amount of the barrier layer 305 on top of the gate insulating layer 303. Typically, the trench depth is selected to leave about 100–200 Å or more of the barrier layer 207 on top of the gate insulating layer 303. This thickness is a little thicker than that of the earlier embodiment, since in this process, the material used to form the gate electrode will typically be subject to higher temperature thermal processing.

A conductive material 309 is formed over the substrate 301 to fill the trench. The conductor material 309 can be planarized such that the top surface of the conductor material lies flat with the top surface of the barrier layer 305. The resultant structure is illustrated in FIG. 3B. The conductive material 309 may be formed of a number of different materials including, for example, metals such as copper, aluminum or tungsten, or even doped polysilicon. In the example embodiment, the conductive material 309 is formed from copper. The copper may, for example, be formed by depositing a layer of copper using, for example, electroplating or MOCVD techniques. The copper may be planarized with the top surface of the barrier layer 305 using, for example, well-known chemical-mechanical polishing techniques.

Portions of the barrier layer 305 and underlying gate insulating layer 303 adjacent the conductive material 309 are removed to form a gate electrode structure 313. The removal process may be performed using, for example, well-known photolithography and etching techniques. Typically, the removal process leaves a portion 311 of the barrier layer 305 on sidewalls of the conductive material 309. Source/drain regions 315 may then be formed in active regions of the substrate 301 adjacent gate electrode structure 313. The source/drain regions 315 may be formed using, for example, well-known techniques. The resultant structure is illustrated in FIG. 3C. The resultant structure generally includes a gate electrode structure 313 having a gate electrode formed from the conductive material 309 on top of a gate insulating layer 303. In the example embodiment, a U-shaped barrier layer 311 is formed around the conductive material 309.

Generally, the techniques used to form the source/drain regions typically involve annealing or heating the substrate at elevated temperatures (e.g., typically above 900° C.). However, by using a relatively thick barrier layer (e.g., 100–200 Å or more thick), the conductive material 309 (e.g., copper) is prevented from diffusing through the barrier layer 305 and the gate insulating layer 303.

As noted above, the present invention is applicable to the fabrication of a number of different devices which can benefit from high performance gate electrode structures. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

What is claimed is:

1. A process of fabricating a semiconductor device, comprising:
    forming a gate insulating layer over a substrate;
    forming a diffusion barrier layer over the gate insulating layer;
    forming a trench in the diffusion barrier layer; and
    forming a metal gate electrode in the trench,
    wherein the diffusion barrier layer impedes diffusion of the metal gate electrode into the gate insulating layer.

2. The process of claim 1, wherein the gate insulating layer has a permittivity greater than silicon dioxide.

3. The process of claim 1, wherein the gate insulating layer is formed from cobalt niobate.

4. The process of claim 1, wherein the barrier layer is formed from a conductive material.

5. The process of claim 1, wherein the barrier layer is formed from tantalum silicon nitride.

6. The process of claim 1, wherein the metal gate electrode is formed from copper.

7. The process of claim 1, wherein forming the metal gate electrode in the trench includes:
    depositing a layer of metal over the substrate to fill the trench; and
    planarizing the metal layer with a top surface of the trench.

8. The process of claim 7, further including removing portions of the diffusion barrier layer and gate insulating layer adjacent the gate electrode to expose the substrate.

9. The process of claim 8, wherein removing portions of the diffusion barrier layer and gate insulating layer includes leaving a region of the diffusion barrier layer on sidewalls of the gate electrode.

10. The process of claim 1, further including forming elevated active regions on the substrate prior to forming the gate insulating layer, wherein the gate insulating layer is formed between the elevated active regions.

11. The process of claim 10, wherein forming the trench in the barrier layer includes forming a contact trench in the barrier layer over each elevated active region.

12. The process of claim 11, further including forming a metal layer over the substrate to fill the trench and the contacts trenches, the metal layer in the contact trenches forming metal contacts.

13. The process of claim 11, further including forming two dielectric regions in the barrier layer, the dielectric regions isolating a first portion of the barrier layer between the active regions from second portions of the barrier layer over the active regions.

14. A process of fabricating a semiconductor device comprising:
    forming elevated active regions over a substrate;
    forming a gate insulating layer between the active regions;
    forming a barrier layer over the gate insulating layer and the active regions;
    forming two dielectric regions isolating a first portion of the barrier layer over the gate insulating layer from second portions of the barrier layer over the active regions; and
    forming a gate electrode in the first portion and an active region contact in each of the second portions of the barrier layer.

15. The process of claim 14, wherein the gate insulating layer has a permittivity greater than silicon dioxide.

16. The process of claim 14, wherein the gate insulating layer is formed from cobalt niobate.

17. The process of claim 14, wherein the barrier layer is formed from tantalum silicon nitride.

18. The process of claim 14, wherein forming the two dielectric regions includes:
   selectively removing portions of the barrier layer to form dielectric trenches separating the first portion of the barrier layer from the second portions of the barrier layer; and
   filling the dielectric trenches with a dielectric material.

19. The process of claim 14, wherein the dielectric regions extend down to the gate insulating layer.

20. The process of claim 14, wherein forming the gate electrode and the active region contacts includes:
   forming a trench in the first portion of the barrier layer and in each second portion of the barrier layer; and
   filling the trenches with a conductive material.

21. The process of claim 20, wherein forming the trenches forms U-shaped barrier layer portions.

* * * * *